United States Patent
Mizusaki et al.

(10) Patent No.: US 7,371,468 B2
(45) Date of Patent: May 13, 2008

(54) ORGANIC EL LIGHT EMITTING DEVICE AND LIQUID CRYSTAL DISPLAY USING THE SAME

(75) Inventors: Masanobu Mizusaki, Tenri (JP); Motohiro Yamahara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 425 days.

(21) Appl. No.: 10/500,653

(22) PCT Filed: Mar. 13, 2003

(86) PCT No.: PCT/JP03/03034

§ 371 (c)(1), (2), (4) Date: Jul. 2, 2004

(87) PCT Pub. No.: WO03/081688

PCT Pub. Date: Oct. 2, 2003

(65) Prior Publication Data

US 2005/0063175 A1    Mar. 24, 2005

(30) Foreign Application Priority Data

Mar. 26, 2002   (JP) .............................. 2002-084972

(51) Int. Cl.
*H01L 29/08* (2006.01)
*H01J 1/62* (2006.01)

(52) U.S. Cl. ...................... 428/690; 428/917; 313/504; 313/506; 252/301.16; 257/40; 257/102; 257/103

(58) Field of Classification Search ................ 428/917, 428/690; 257/40, E51, 102, 103; 549/74, 549/80; 525/63; 252/301.16; 313/504, 313/506
See application file for complete search history.

(56) References Cited

U.S. PATENT DOCUMENTS

| | | | |
|---|---|---|---|
| 4,772,885 A | | 9/1988 | Uehara et al. |
| 6,534,329 B2 * | | 3/2003 | Heeger et al. ............... 438/22 |
| 6,783,814 B2 * | | 8/2004 | Swager et al. ............... 428/11 |
| 2005/0194603 A1 * | | 9/2005 | Slater et al. .................. 257/98 |

FOREIGN PATENT DOCUMENTS

| | | |
|---|---|---|
| EP | 1 011 154 A1 | 6/2000 |
| EP | 1 081 774 A2 | 3/2001 |
| JP | 62-227121 | 10/1987 |
| JP | 11-204261 | 7/1999 |
| JP | 11-316376 | 11/1999 |
| WO | WO 01/59030 A1 | 8/2001 |

OTHER PUBLICATIONS

Masaaki Kamkimoto, Kagaku, vol. 50, pp. 608-612, 1995.
Masaaki Kakimoto, Kobunshi, vol. 47, pp. 804-807, 1998.

(Continued)

*Primary Examiner*—Terrel Morris
*Assistant Examiner*—Camie Thompson
(74) *Attorney, Agent, or Firm*—Keating & Bennett, LLP

(57) ABSTRACT

The organic EL light emitting device of the invention has an organic EL light emitting layer (3*a*, 3*b*, 3*c*) and an electrode (1, 4) for applying a voltage to the organic EL light emitting layer. The organic EL light emitting layer includes a hyperbranched polymer layer having hyperbranched macromolecules uniaxially aligned with a degree of alignment of 0.95 or more, and emits light with a high emission polarization ratio.

21 Claims, 7 Drawing Sheets

OTHER PUBLICATIONS

M. Redecker et al., "Mobility Enhancement Through Homogeneous Nematic Alignment Of A Liquid-Crystalline Polyfluorene", Applied Physics Letters, vol. 74, No. 10, pp. 1400-1402, Mar. 1999.

K.S. Whitehead et al., "Highly Polarized Blue Electroluminescence From Homegeneously Aligned Films Of Poly (9,9-dioctylfluorene)", Applied Physics Letters, vol. 76, No. 20, pp. 2946-2948, May 2000.

Craig J. Hawker et al., "Preparation Of Polymers With Controlled Molecular Architecture. A New Convergent Approach To Dentritic Macromolecules", J. Am. Chem. Soc., vol. 112, No. 21, pp. 7638-7647, 1990.

Woo-Dong Jang et al., "Dentritic Physical Gel: Hierarchical Self-Organization Of Petptide-Core Dendrimer to Form a Micrometer-Scale Fibrous Assembly", J. Am. Chem. Soc., vol. 122, No. 13, pp. 3232-3233, 2000.

Virgil Percec et al., "Synthesis And Structural Analysis Of Two Constitutional Isomeric Libraries of $AB_2$-Based Monodendrons and Supramolecular Dendrimers", J. Am. Chem. Soc., vol. 123, pp. 1302-1315, 2001.

Xu-Tang Tao et al., "Hyperbranched Polymers For Electroluminescence Applications", Advanced Materials, vol. 10, No. 3, pp. 226-230, 1998.

Official Communication issued in the corresponding Japanese Application No. 2002084972, mailed on Nov. 28, 2006.

Oyo Buturi; vol. 68, No. 1, 1999, pp. 26-32.

Motohiro Yamahara et al.; "Polymer Structure and Functional Element Having the Same, and Transistor and Display Using the Same", U.S. Appl. No. 10/488,478 filed on Mar. 1, 2004.

* cited by examiner

: DENDRITIC BRANCHING START POINT

FIRST GENERATION

SECOND GENERATION

THIRD GENERATION

ORGANIC EL LIGHT EMITTING DEVICE AND LIQUID CRYSTAL DISPLAY USING THE SAME

BACKGROUND OF THE INVENTION

1. Field of the Invention

The present invention relates to an organic electroluminescent (EL) light emitting device and a liquid crystal display using the same. More particularly, the present invention relates to an organic EL light emitting device emitting polarized light and a liquid crystal display using the same.

2. Description of the Related Art

In recent years, liquid crystal displays (LSDs) have been used, in place of CRTs, in various fields including T.V. sets, personal computers and personal digital assistants (PDAs). As displays, plasma displays, organic EL displays, inorganic EL displays and the like have also received attention, and commercialization of these displays is now under way.

Among others, organic EL displays, which can emit light spontaneously and use a thin film, are expected as promising light and thin displays. Moreover, great progress has been made in development of materials lately. Actually, a material capable of emitting three colors of blue, green and red efficiently has been developed.

A liquid crystal display using an organic EL light emitting device as the backlight has been proposed in Japanese Laid-Open Patent Publication Nos. 61-153693 and 62-227121, for example. Also, Japanese Laid-Open Patent Publication No. 11-316376 discloses use of an organic EL light emitting device emitting polarized light as the backlight to thereby omit one polarizer of a liquid crystal display, and discusses that this can not only reduce power consumption but also improve the light use efficiency.

The emission polarization ratio of the conventional organic EL light emitting device is about 20:1 at best, which is one-hundredth or less of the extinction polarization ratio (3000:1) of a polarizer presently used in a liquid crystal display. Note that herein the ratio in intensity between linearly polarized light rays orthogonal to each other is called the "emission polarization ratio" for the light emitted from an organic EL light emitting device, while the same ratio is called the "extinction polarization ratio" for the light transmitted by a polarizer.

For example, the aforementioned Japanese Laid-Open Patent Publication No. 11-316376 discloses enhancing the degree of alignment of an organic EL layer by means of rubbing, oblique evaporation or mechanical deposition. However, this method fails to provide a sufficiently high emission polarization ratio. Japanese Laid-Open Patent Publication No. 11-204261 discloses a method in which a rubbed alignment film is placed between a light emitting layer and an anode electrode and a liquid crystalline light emitting material is aligned with the alignment film. This method fails to provide a sufficiently high emission polarization ratio, either.

If the emission polarization ratio of a backlight is low, the quality of black display decreases due to light leakage. Therefore, a sufficient contrast ratio will not be obtained without provision of a polarizer on the side of the backlight.

In view of the above problems, a main object of the present invention is providing an organic EL light emitting device having a higher emission polarization ratio than that conventionally obtained, and a liquid crystal display using such an organic EL light emitting device.

SUMMARY OF THE INVENTION

The organic EL light emitting device of the present invention has an organic EL light emitting layer and an electrode for applying a voltage to the organic EL light emitting layer, wherein the organic EL light emitting layer includes a hyperbranched polymer layer having hyperbranched macromolecules uniaxially aligned with a degree of alignment of 0.95 or more and emits polarized light.

In a preferred embodiment, the hyperbranched polymer layer includes self-organized disc-shaped hyperbranched macromolecules. In another preferred embodiment, the hyperbranched polymer layer includes self-organized rod-shaped hyperbranched macromolecules. The hyperbranched macromolecules preferably include dendrimers.

The hyperbranched macromolecules are preferably self-organized by electrostatic interaction or by hydrogen bonding.

The organic EL light emitting device of a preferred embodiment further includes a wall structure having a side face roughly perpendicular to a surface of the hyperbranched polymer layer, wherein the hyperbranched macromolecules are aligned roughly in parallel with the side face by interaction with the wall structure. For example, the side face of the wall structure is charged, and the hyperbranched macromolecules electrostatically interact with the side face. Otherwise, the side face of the wall structure has a hydrogen-bonding property, and the hyperbranched macromolecules hydrogen-bond with the side face.

The hyperbranched polymer layer may include a first hyperbranched polymer layer functioning as an electron transport layer or a hole transport layer and a second hyperbranched polymer layer functioning as at least a light emitting layer. Naturally, the hyperbranched polymer layer may include a single layer having the functions of the electron transport layer, the hole transport layer and the light emitting layer, or may include three layers having the functions of the respective layers. Otherwise, one hyperbranched polymer layer may have the function of the light emitting layer and the function of the electron transport layer or the hole transport layer.

The liquid crystal display of the present invention includes any of the organic EL light emitting devices described above and a liquid crystal panel receiving polarized light emitted from the organic EL light emitting device and controlling the transmittance of the polarized light.

In a preferred embodiment, the organic EL light emitting device includes a wall structure having a side face roughly perpendicular to a surface of the hyperbranched polymer layer, the hyperbranched macromolecules being aligned roughly in parallel with the side face by interaction with the wall structure, the liquid crystal panel has a plurality of pixels and a black matrix shading spaces between the plurality of pixels, and the wall structure of the organic EL light emitting device is formed to correspond to the black matrix of the liquid crystal panel.

The method for fabricating an organic EL light emitting device of the present invention is a method for fabricating an organic EL light emitting device having an organic EL light emitting layer and an electrode for applying a voltage to the organic EL light emitting layer, the organic EL light emitting device emitting polarized light. The method includes the steps of: (a) preparing a substrate having an electrode formed on its principal plane; (b) forming a wall structure on the principal plane, the wall structure having a side face roughly perpendicular to the principal plane; and (c) providing a material including hyperbranched macromolecules on the principal plane to form the organic EL light emitting layer including a hyperbranched polymer layer having the hyperbranched macromolecules aligned roughly in parallel with the side face.

In a preferred embodiment, the step (b) includes the step of charging the side face, and the hyperbranched macromolecules are aligned roughly in parallel with the side face by electrostatic interaction with the side face. The method may further include the step of providing a material including other hyperbranched macromolecules electrostatically interacting with the previous hyperbranched macromolecules.

In another preferred embodiment, the step (b) includes the step of imparting a hydrogen-bonding property to the side wall, and the hyperbranched macromolecules are aligned roughly in parallel with the side wall by hydrogen bonding with the side face. The method may further include the step of providing a material including other hyperbranched macromolecules hydrogen-bonding with the previous hyperbranched macromolecules.

DETAILED DESCRIPTION OF PREFERRED EMBODIMENTS

Figure 1:
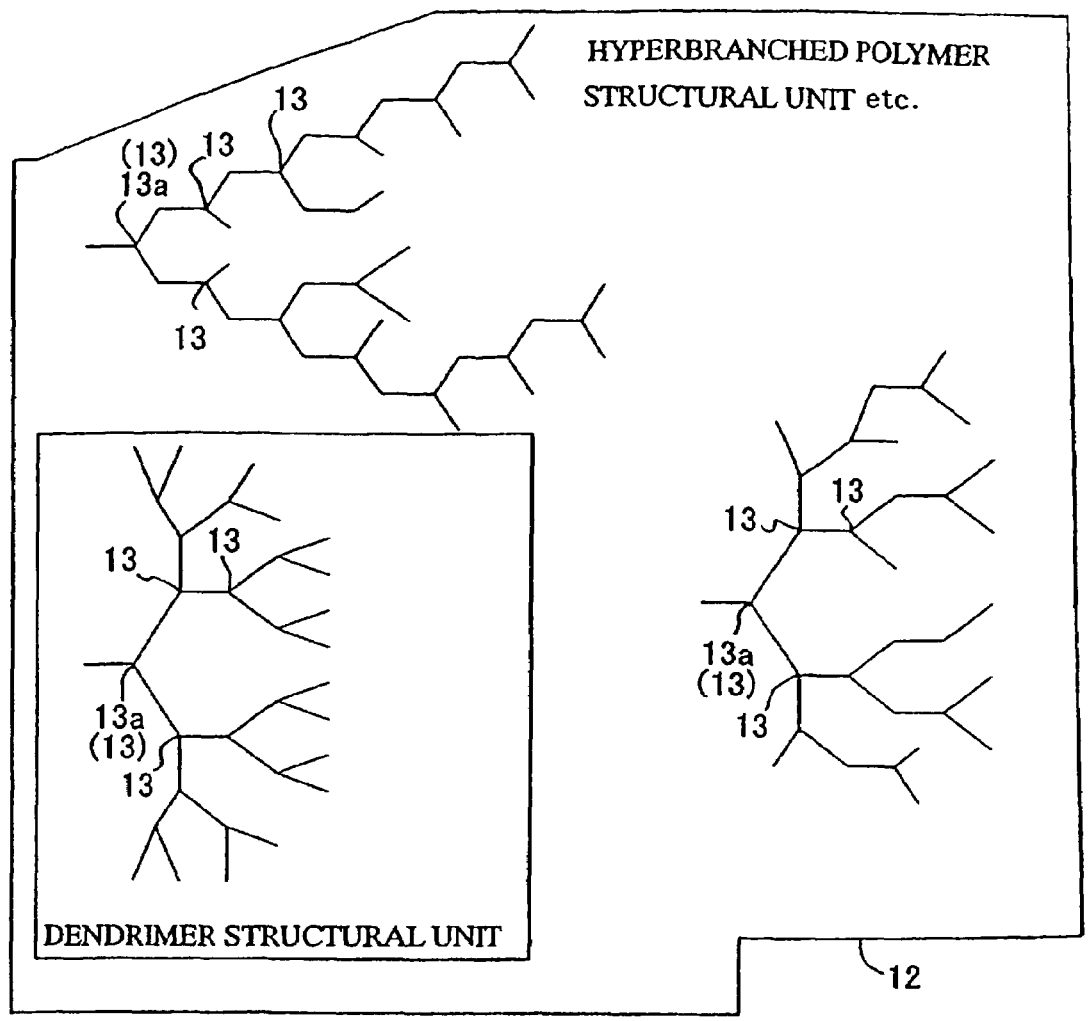
FIG. 1 is a conceptual view diagrammatically illustrating structures and classification of hyperbranched macromolecules.

Hereinafter, the constructions and functions of an organic EL light emitting device and a liquid crystal display using the same of preferred embodiments of the present invention will be described with reference to the relevant drawings. It should be noted that the present invention is not limited to the embodiments to follow.

The organic EL light emitting device of an embodiment of the present invention includes an organic EL light emitting layer and an electrode for applying a voltage to the organic EL light emitting layer, as does a known organic EL light emitting device. The organic EL light emitting layer of the organic EL light emitting device of this embodiment includes a hyperbranched polymer layer in which hyperbranched macromolecules are uniaxially aligned with a degree of alignment of 0.95 or more. With this hyperbranched polymer layer, the organic EL light emitting device of this embodiment can emit polarized light having a higher emission polarization ratio (50:1 or more, for example) than that conventionally obtained.

The construction and function of the organic EL light emitting layer of the organic EL light emitting device of this embodiment will be described in comparison with a conventional organic EL light emitting layer.

Conventionally, as an organic EL light emitting layer emitting polarized light, a liquid crystalline polymer light emitting material is used as described in Applied Physics Letters, Vol. 76, No. 20, p. 2946 (2000), Applied Physics Letters, Vol. 74, No. 10, p. 1400 (1999) and the like. According to these publications, the emission polarization ratio is of the order of 10:1 to 20:1.

In general, the degree of alignment of a liquid crystal layer sandwiched by alignment films is known as about 0.8, and the degree of alignment and the emission polarization ratio (or distinction polarization ratio) have the relationship represented by equation (1).

$$R=(I_P-G\cdot I_V)/(I_P+2G\cdot I_V) \qquad (1)$$

where R is the degree of alignment, $I_P$ is the intensity of emitted light (transmitted light) in the parallel direction, $I_V$ is the intensity of emitted light (transmitted light) in the vertical direction, and G is a correction factor (herein, G=1).

Liquid crystal molecules express a property of being aligned because they have inter-molecular interactions that are not caused by covalent bonding (non-covalent bonding interaction), such as the π-π interaction between aromatic atomic groups included in the liquid crystal molecules and the dipole-dipole interaction between other substituents. However, since the non-covalent bonding interactions acting between liquid crystal molecules are comparatively weak, it is difficult to enhance the degree of alignment to 0.9 or more.

The inventors of the present invention has found that the degree of alignment of molecules of the light emitting layer can be enhanced by use of hyperbranched macromolecules that have a non-covalent bonding interaction stronger than the π-π interaction and the dipole-dipole interaction. The present invention has been attained based on the above findings.

The hyperbranched macromolecule as used herein refers to a macromolecule that has at least one hyperbranched structural unit having a branched structure of an arbitrary shape. Herein, the "hyperbranched structural unit" is defined to include a dendrimer structural unit and a hyperbranched polymer structural unit as diagrammatically illustrated in FIG. 1. A dendrimer and a hyperbranched polymer are described in M. Kakimoto, "Kagaku", Vol. 50, p. 608 (1995) and "Kobunshi", Vol. 47, p. 804 (1998), for example.

A hyperbranched structural unit 12 has one dendritic branching start point 13a. The number of branch points 13 included in the hyperbranched structural unit 12 is not limited. The hyperbranched structural unit 12 may have a single branch point 13 that is the dendritic branching start point 13a. The hyperbranched structural unit 12 may have a regular repetitive branched structure as the dendrimer structural unit, or may have an irregular repetitive branched structure as the hyperbranched polymer structural unit.

Figure 2:
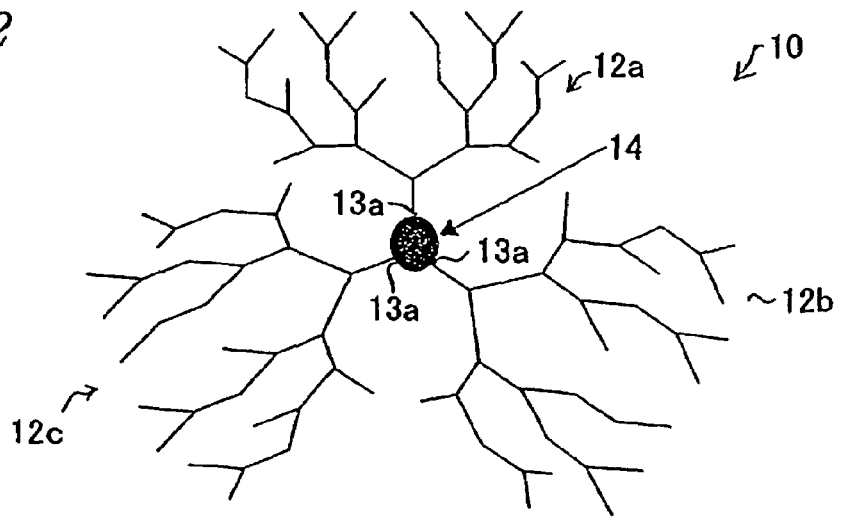
FIG. 2 is a diagrammatic view of a structure of a hyperbranched macromolecule used in the present invention.

The hyperbranched macromolecule as used herein may have at least one hyperbranched structural unit 12 shown in FIG. 1. As shown in FIG. 2, however, a hyperbranched macromolecule 10 preferably has a plurality of hyperbranched structural units 12 (12a to 12c) coupled to a center structure (core) 14. In particular, the hyperbranched macromolecule 10 and self-organized structures of the hyperbranched macromolecule 10 desirably have a molecular structure (symmetry) that facilitates uniaxial alignment. In view of this, the number of hyperbranched structural units 12 is preferably 3 or 4. The hyperbranched structural units 12 may be different from each other, but are preferably the same from the standpoint of the symmetry of the structure. In particular, a disc-shaped or rod-shaped hyperbranched macromolecule 10 is preferred.

The hyperbranched macromolecule 10 shown in FIG. 2 has a structure in which the dendritic branching start points 13a of the three hyperbranched structural units 12a, 12b and 12c are coupled to a 3-functional atomic group as the center structure 14. The center structure 14 and the hyperbranched structural units 12 are typically coupled together by covalent bonding, but non-covalent bonding such as hydrogen bonding and coordinate bonding may be adopted.

The hyperbranched structural units 12a, 12b and 12c may be different from one another, or may be the same. Preferably, the three hyperbranched structural units 12a, 12b and 12c are the same so as to provide the hyperbranched macromolecule 10 with the property of being uniaxially aligned. Note that in the following description, the multi-functional atomic group as the center structure 14 is also denoted by the reference numeral 14.

The hyperbranched macromolecule 10 used in the present invention may be a macromolecule of which the surface has hole conductivity, electron conductivity or ion conductivity, a macromolecule having energy interaction between the surface and inside thereof, or a macromolecule of which dendrons (repeat units of the hyperbranched structural units) have carrier conductivity. When the surface of the hyperbranched macromolecule 10 has carrier conductivity, carriers migrate by hopping between terminal groups having carrier conductivity. When dendrons have carrier conductivity, such as when dendrons have a structure having $\pi$ electrons such as a $\pi$ conjugated chain, carriers can also migrate between the center structure 14 and the hyperbranched structural units 12. In this case, the function possessed by the center structure 14 can be derived.

The center structure 14 of the hyperbranched macromolecule 10, coupled with an arbitrary number of dendritic branching start points 13a, is defined as the structure of the portion of the hyperbranched macromolecule 10 other than all the hyperbranched structural units 12 formed from the dendritic branching start points 13a. Typically, the hyperbranched macromolecule 10 suitably used in the present invention has a plurality of hyperbranched structural units 12 placed around the center structure 14 forming a highly symmetric stereo structure. Hence, the center structure 14 is located in the center of the stereo structure.

Examples of the multi-functional atomic group constituting the center structure 14 are: (1) an alkylene group non-substituted or substituted with a hydroxy group, a carboxyl group, an acyl group, or a halogen atom such as a fluorine atom, a chlorine atom, a bromine atom or an iodine atom, having 1 to 20 carbon atom(s), in which a heteroatom such as O, NH, N(CH$_3$), S and SO$_2$ may be interposed; (2) an arylene group having 6 to 20 carbon atoms; (3) a group including such an alkylene group and arylene group coupled to each other; (4) a multivalent group from any of the groups (1) to (3) in which a hydrogen atom coupled to a carbon atom has been released; (5) a multivalent heterocyclic group; (6) a group including the multivalent heterocyclic group and a hydrocarbon group of any of the groups (1) to (4) coupled to each other; and (7) porphyrin and a porphyrin complex.

The dendron of the hyperbranched macromolecule 10 used in the present invention may be an aromatic group or an aliphatic group. More specifically, the dendron may be of a polymer structure such as an aromatic or aliphatic polyether structure, an aromatic polyester structure, a polysiloxane structure, a polycarbosilane structure, a polyether amide structure, a polyamide amine structure and a polypropylene imine structure, or a conjugated polymer structure such as polyphenylene, polyphenylene vinylene and polyphenylene ethynylene. A heterocyclic group such as polythiophene, polythienylene vinylene, polypyrrole and polysilole may be included.

To impart carrier conductivity to the dendron, the dendron may have a $\pi$ conjugated structure. Otherwise, as a hole conductive structure, a structure having a dialkyl-phenyl amine residue, a structure having a triphenyl amine residue, a phenanthroline residue, an imidazole residue and the like may be provided. As an electron conductive structure, a naphthalenetetracarboxylate diimide residue and the like may be provided. As an ion conductive structure, salt composed of anions of carboxylate and sulfonate functional groups and the like and cations of alkali metal, alkaline-earth metal and the like may be provided.

An atomic group (functional group) of other functionality may be introduced into the hyperbranched macromolecule, to obtain combined functions. For example, a group having fluorescence, a group having ultraviolet absorption and the like may be introduced into the molecule. Specifically, a rhodamine pigment and the like may be introduced into the center structure of a dendrimer, for example.

Figure 3:
FIG. 3 is a diagrammatic view illustrating the concept of the number of generations of a dendrimer.
Figure 3:
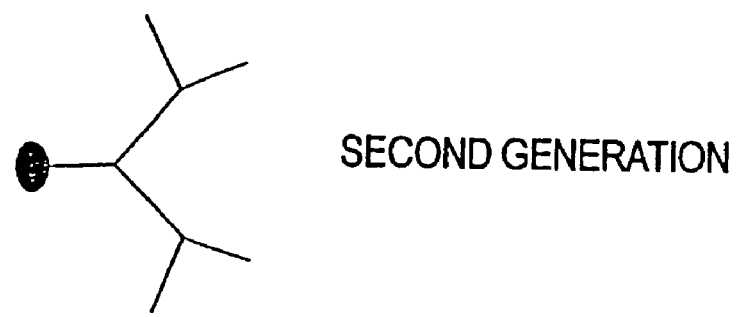
Figure 3:
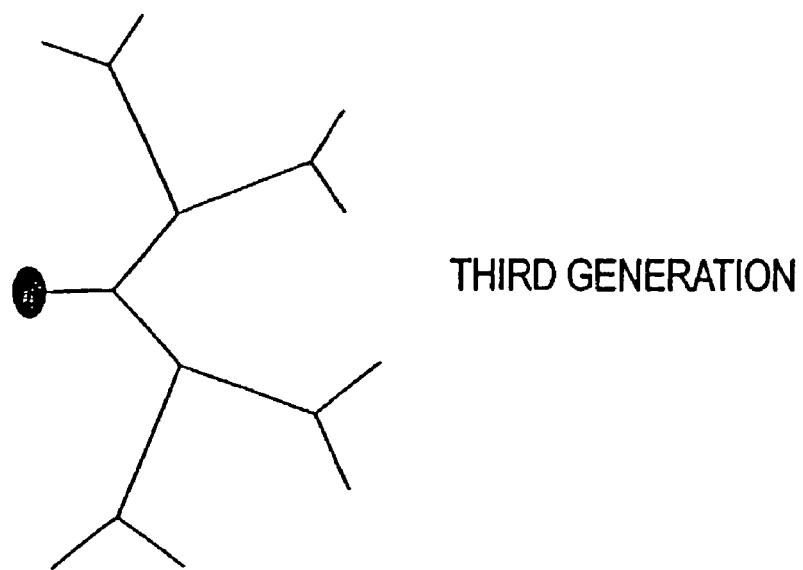

The branched structure of the hyperbranched macromolecule 10 used for the organic EL light emitting device of the present invention is not limited as long as it has the hyperbranched structural unit 12. However, from the standpoint of the symmetry of the molecular structure, the hyperbranched macromolecule 10 is preferably a dendrimer. In the case of a dendrimer, the number of generations of the dendrimer as the hyperbranched macromolecule 10 is not particularly limited, but is typically 1 to 10 including those having large and/or long center structures 14. The number of generations is preferably 2 to 8, more preferably 3 to 7, most preferably 3 to 5, in consideration of the density of terminal groups (terminals of the hyperbranched structural unit 12, that is, terminals constituting the surface of the hyperbranched macromolecule 10) and the easiness of synthesis. The generation of a dendrimer refers to the order of regular branching as shown in FIG. 3.

The organic EL light emitting layer of the organic EL light emitting device of this embodiment has a feature that it includes a hyperbranched polymer layer having hyperbranched macromolecules uniaxially aligned with a degree of alignment of 0.95 or more.

Figure 4A:
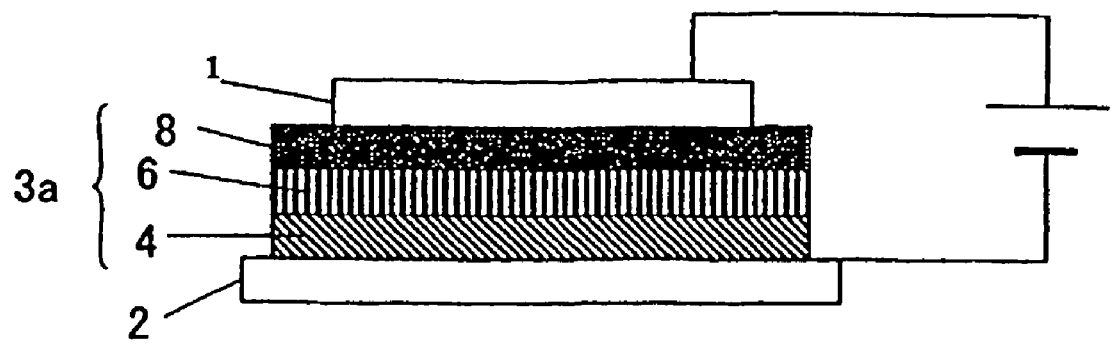
FIGS. 4A, 4B and 4C are diagrammatic cross-sectional views of examples of an organic EL light emitting device of the present invention.
Figure 4B:
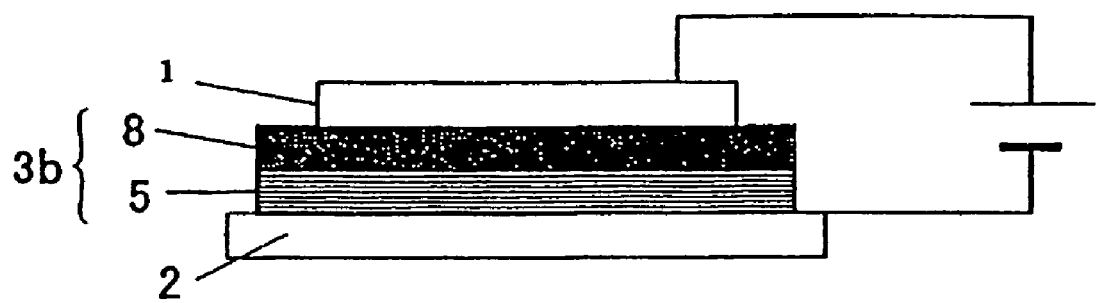
Figure 4C:
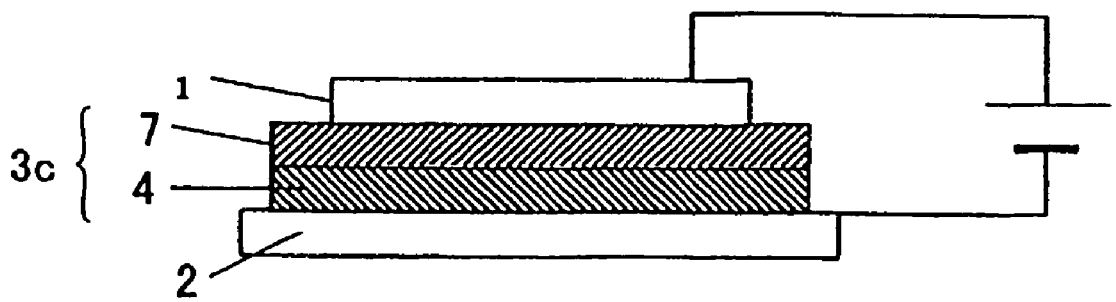

As used herein, the organic EL light emitting layer refers to a layer having the functions of a hole transport layer, an electron transport layer and a light emitting layer. For example, as shown in FIG. 4A, an organic EL light emitting layer 3a interposed between electrodes 1 and 2 includes a hole transport layer 4, a light emitting layer 6 and an electron transport layer 8. Alternatively, the organic EL light emitting layer may include a first layer 5 having the functions of the hole transport layer and the light emitting layer and the electron transport layer 8 as shown as an organic EL light emitting layer 3b in FIG. 4B, or may include the hole transport layer 4 and a second layer 7 having the functions of the light emitting layer and the electron transport layer as shown as an organic EL light emitting layer 3c in FIG. 4C. Otherwise, although not shown, the organic EL light emitting layer may include a single layer having all the functions of the hole transport layer, the electron transport layer and the light emitting layer.

The organic EL light emitting layer of the organic EL light emitting device of this embodiment includes a hyperbranched polymer layer as described above, It is therefore possible to obtain a hyperbranched polymer layer having a plurality of functions by appropriately selecting the center structure 14 and the atomic group of the hyperbranched structural unit 12 of the hyperbranched macromolecule 10 as described above. In the case that the organic EL light emitting layer is composed of a plurality of layers, all the layers are preferably formed of hyperbranched macromolecules. However, if at least the light emitting layer is a hyperbranched polymer layer having a high degree of alignment, a high emission polarization ratio can be obtained.

Examples of the hyperbranched polymer layer suitably used for the organic EL light emitting layer will be described with reference to FIGS. 5A and 5B.

Figure 5A:
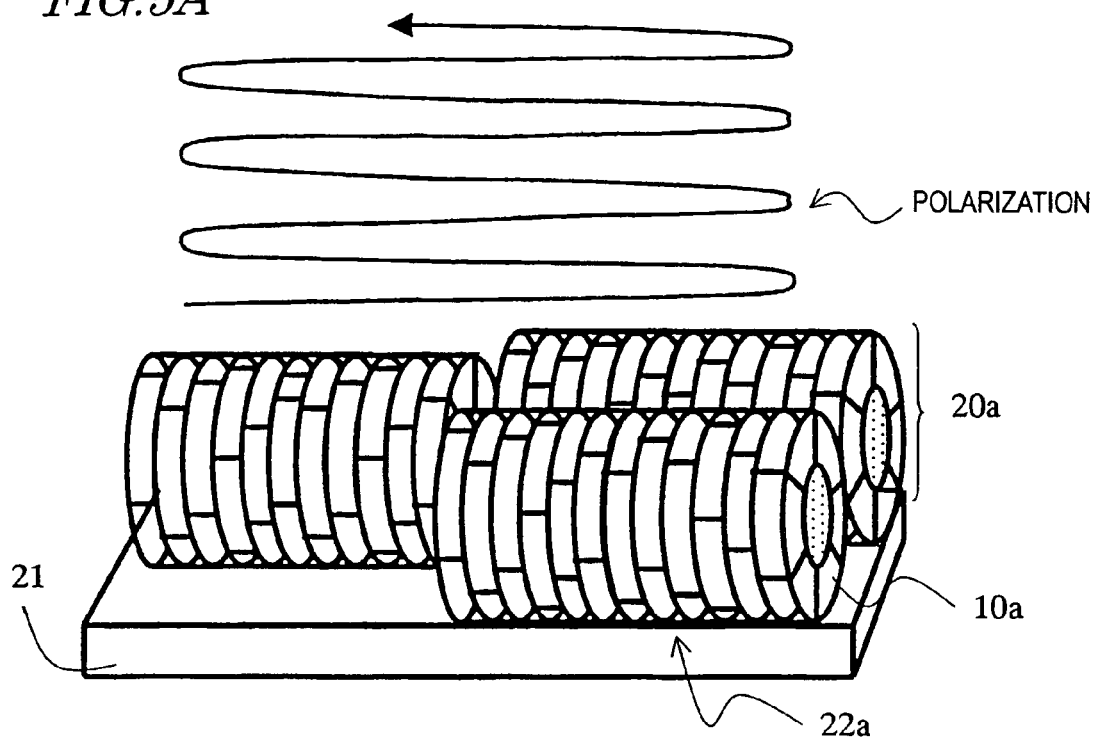
FIGS. 5A and 5B are diagrammatic views of examples of an organic EL light emitting layer composed of a highly uniaxially-aligned hyperbranched polymer layer.

A hyperbranched polymer layer 20a shown in FIG. 5A has rod-shaped self-organized structures 22a formed by non-covalent bonding interaction of disc-shaped dendrimers 10a. The self-organized structures 22a are uniaxially aligned. The respective disc-shaped dendrimers 10a are aligned so that the disc face is roughly normal to the surface of a substrate 21, and the center axes of the discs extend roughly in parallel with the surface of the substrate 21.

Figure 5B:
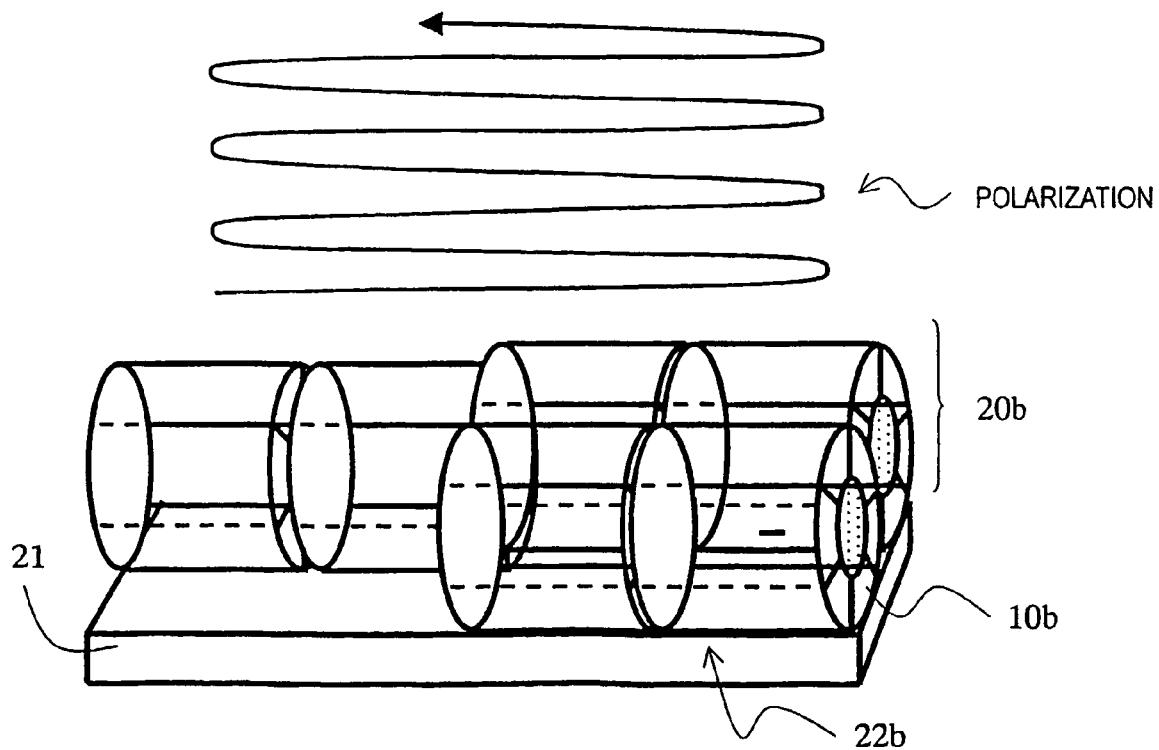

A hyperbranched polymer layer 20b shown in FIG. 5B has rod-shaped self-organized structures 22b formed by non-covalent bonding interaction of rod-shaped dendrimers 10b. The self-organized structures 22b are uniaxially aligned. The respective rod-shaped dendrimers 10b are aligned so that the cross section of the rod is roughly normal to the surface of the substrate 21, and the center axes of the rods extend roughly in parallel with the surface of the substrate 21.

As shown in FIGS. 5A and 5B, disc-shaped or rod-shaped hyperbranched macromolecules are preferably used because they can be easily uniaxially aligned with a high degree of alignment. It is however possible to use hyperbranched macromolecules having any other three-dimensional shape such as a sphere. In any case, dendrimers are preferably used as the hyperbranched macromolecules from the standpoint of the symmetry.

The center portion (the center structure 14 in FIG. 2) of each of the disc-shaped dendrimers 10a and the rod-shaped dendrimers 10b has a luminescent pigment (atomic group).

Preferred examples of the luminescent pigment are luminescent pigments having high planarity, such as benzene, naphthalene, anthracene, phenanthrene, pyrene, perylene, an aluminum-quinoline complex, oligofluorene, oligothiophene, oligophenylene, vinylene, Spiro-NPB, Spiro-TAD and Spiro-DPVBi, although not limited to these materials.

Each dendron portion has an atomic group that allows expression of strong non-covalent bonding interaction between dendrimers. In particular, an atomic group for expressing electrostatic interaction or an atomic group having hydrogen bonding is preferred.

As an atomic group having positive charge (cationic atomic group), ammonium salt and pyridinium salt may be suitably used. As an atomic group having negative charge (anionic atomic group), a sulfonate group and a carboxylate group may be suitably used. As a hydrogen-bonding atomic group, a carboxyl group and an amino group may be suitably used.

The number of layers constituting the organic EL light emitting layer can be reduced by introducing an electron or hole transport atomic group into the outermost shell of each dendron (surface side of the molecule). By reducing the number of layers, the number of steps of the fabrication process can be reduced. A carbazole type is typical as the electron transport atomic group, and an arylamine type and an oxadiazole type are typical as the hole transport atomic group.

The hyperbranched macromolecules described above can be synthesized by a divergent method in which synthesis proceeds from the center toward the outer periphery, or by a convergent method in which synthesis proceeds from the outer periphery toward the center.

Hereinafter, an example of synthesis of benzyl ether type dendrimers having fluorene as a blue luminescent pigment in the center and charge in the outermost shell (molecule surface) will be described.

First, the fluorene structure in the center is brominated and then subjected to Grignard reaction according to Scheme 1 shown below, to obtain Compound 1.

Thereafter, Compound 1 is made to react with a benzyl ether type dendron (Compound 2), and then methyl ester groups are hydrolyzed and carboxylated, to obtain a dendrimer (Compound 3). The dendron (Compound 2) can be synthesized by a method described in Journal of the American Chemical Society, 122, p. 3232 (2000), Journal of the American Chemical Society, 112, p. 7638 (1990), Journal of the American Chemical Society, 123, pp. 1302-1315 (2001), for example.

Scheme 1

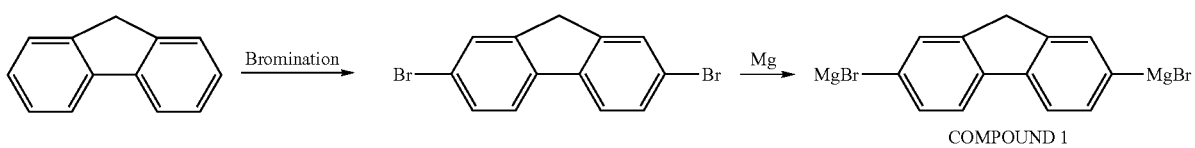

COMPOUND 1

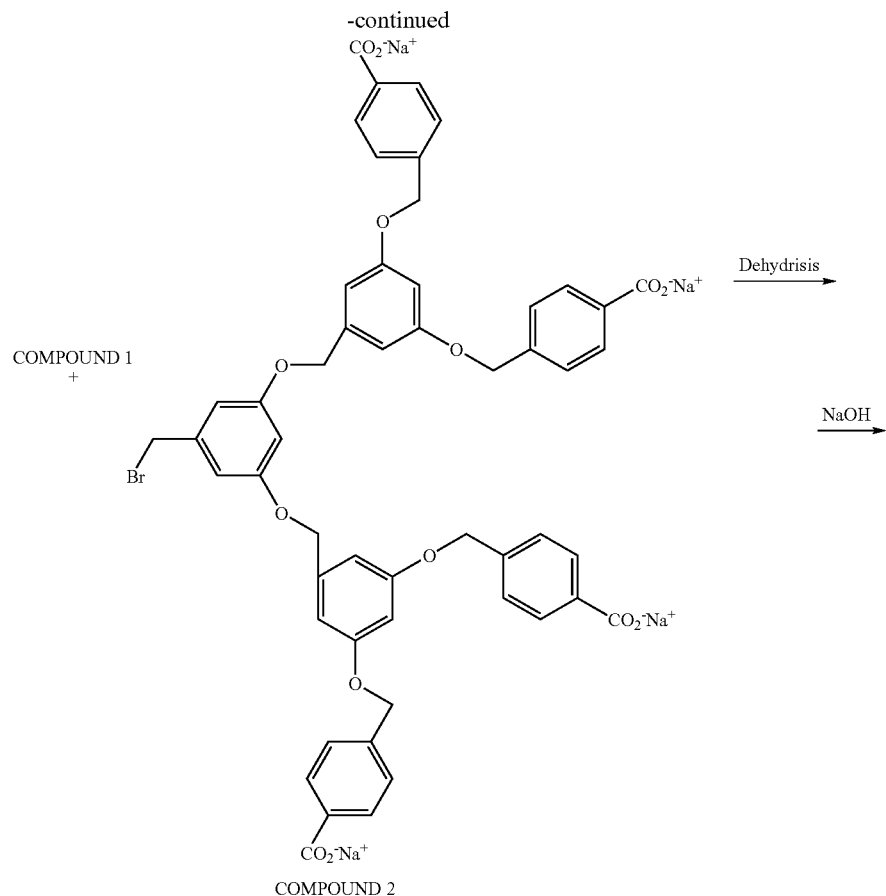
COMPOUND 2
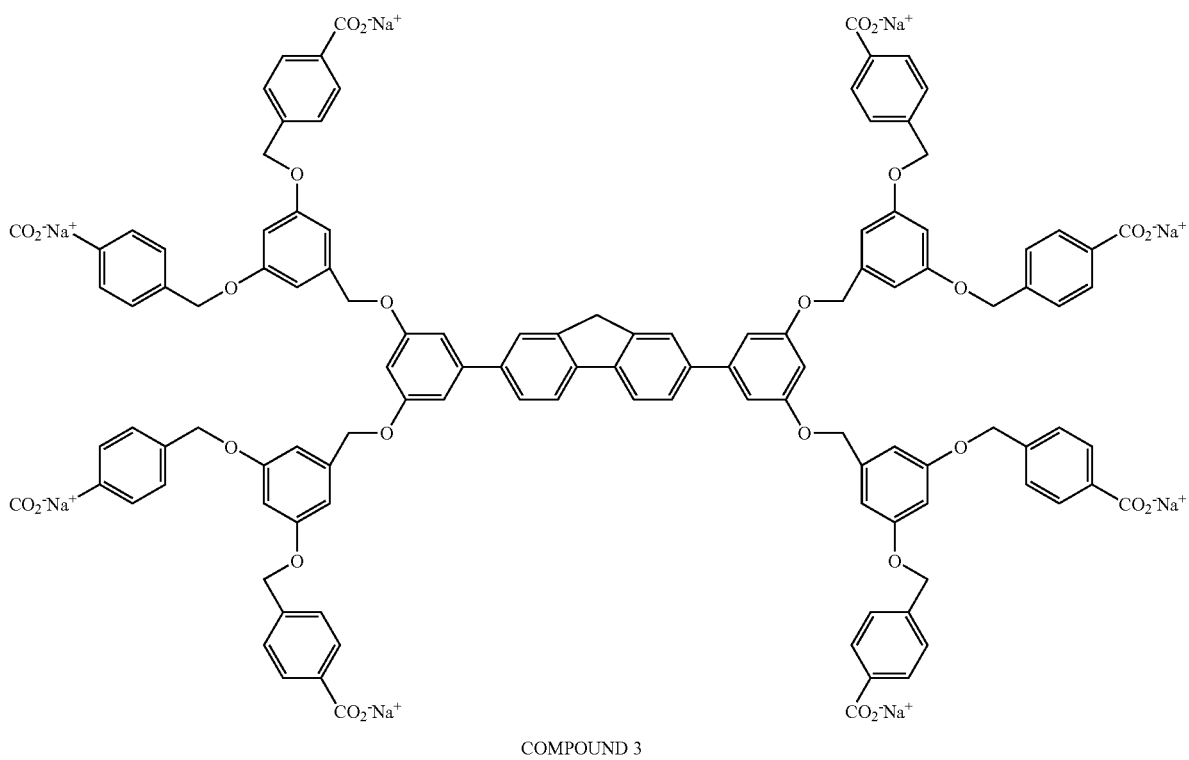
COMPOUND 3

A dendrimer (Compound 4) having positive charge in the outermost shell and dendrimers (Compounds 5 and 6) having a hydrogen-bonding residue can also be synthesized according to Scheme 2 shown below by a synthesis method similar to that described above.
Scheme 2
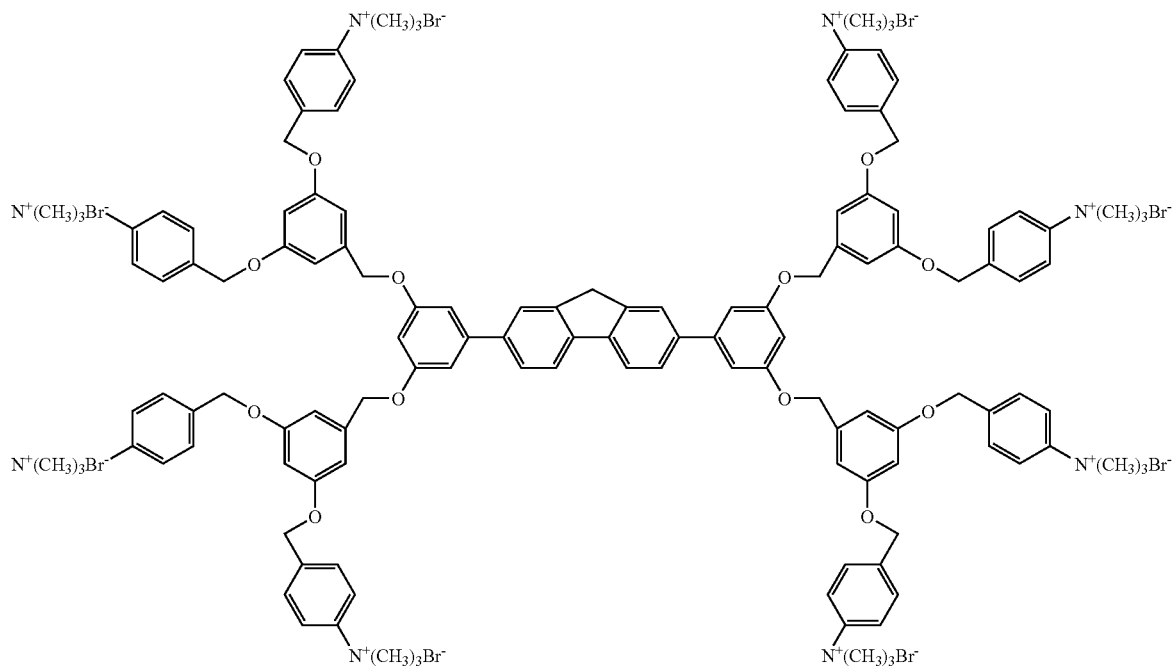
COMPOUND 4
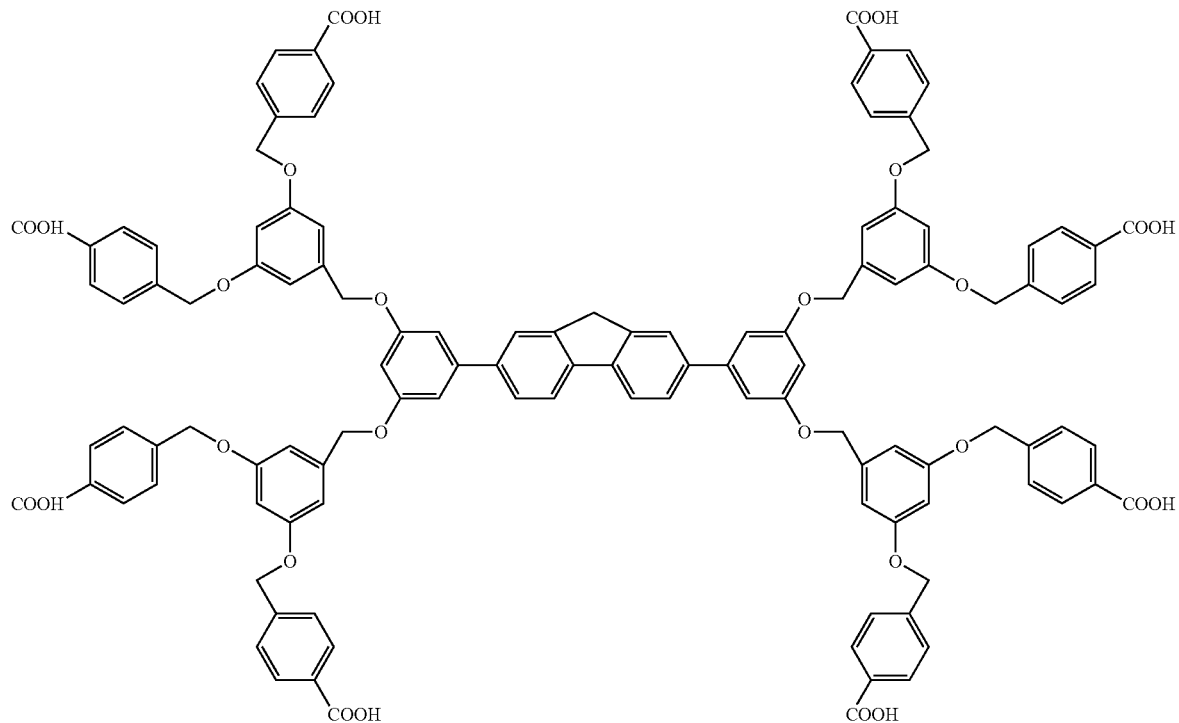
COMPOUND 5

-continued

COMPOUND 6

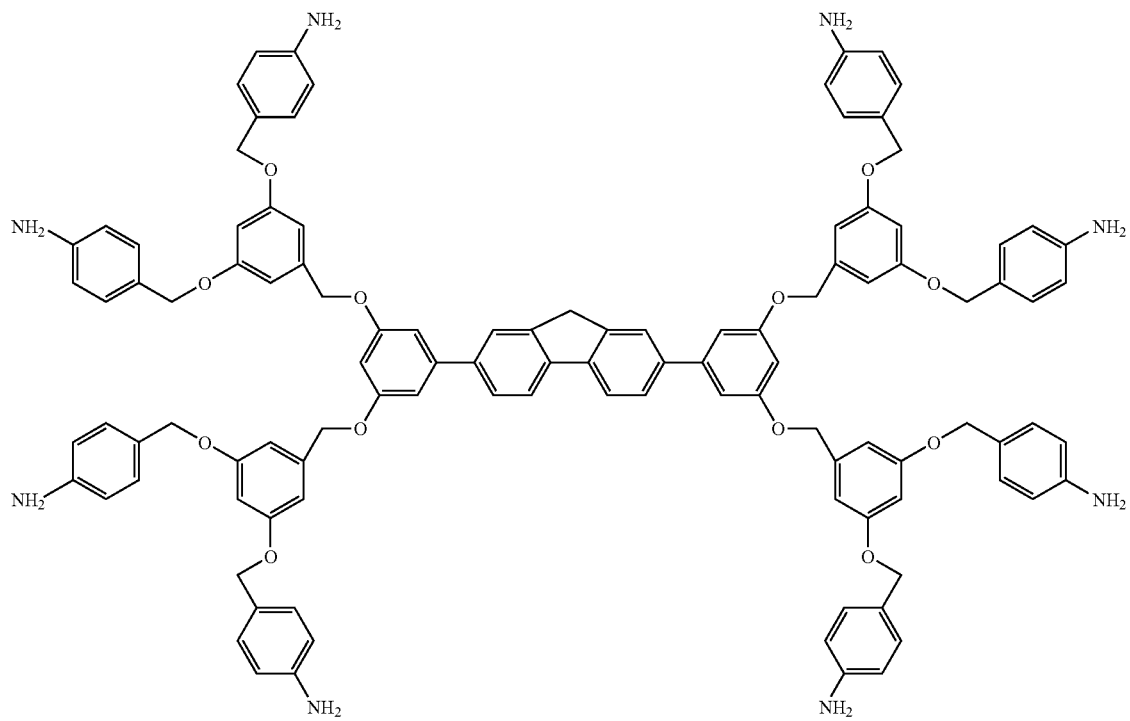

Hereinafter, a method for uniaxially aligning the hyperbranched macromolecules with a high degree of alignment as shown in FIGS. 5A and 5B will be described with reference to FIGS. 6A to 6D.

In this embodiment, a wall structure having a side face roughly perpendicular to the surface of the hyperbranched polymer layer is formed, and using non-covalent bonding interaction between the wall structure and the hyperbranched macromolecules, the hyperbranched macromolecules are aligned in parallel with one another and roughly in parallel with the side face of the wall structure. The non-covalent bonding interaction acting between the wall structure and the hyperbranched macromolecules is preferably strong as is the non-covalent bonding interaction acting between the hyperbranched macromolecules, and is preferably electrostatic interaction or hydrogen bonding.

FIGS. 6A to 6D illustrate uniaxial alignment of the hyperbranched macromolecules 10 using electrostatic interaction as an example.

Figure 6A:
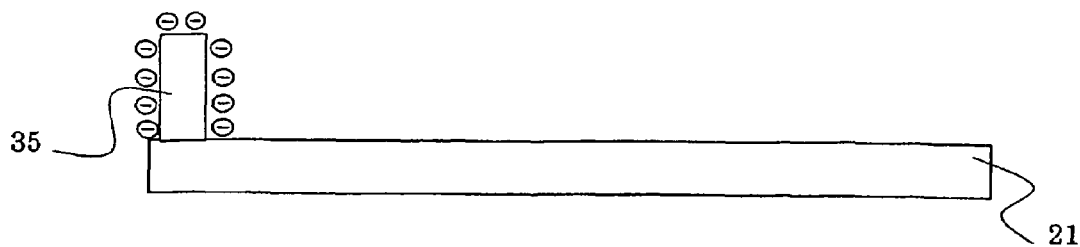
FIGS. 6A to 6D are diagrammatic views demonstrating a process of forming a highly uniaxially-aligned hyperbranched polymer layer.

First, as shown in FIG. 6A, a wall structure 35 is formed on the surface of the substrate 21. For example, the wall structure 35 is formed by forming a film of a polymer material on the surface of the substrate 21 and patterning the polymer film. In particular, by use of a photosensitive polymer material, the wall structure 35 can be formed easily by a photolithographic process. Examples of the polymer material include an acrylic resin, an epoxy resin, a novolac resin, a polyimide resin and the like. If transparency is desired for the wall structure 35, an acrylic resin is preferred. If high mechanical strength is desired, an epoxy resin, a novolac resin or a polyimide resin is preferred. To charge the side face of the wall structure 35, macromolecules or low molecular weight molecules having charge are mixed in the polymer material.

Figure 6B:
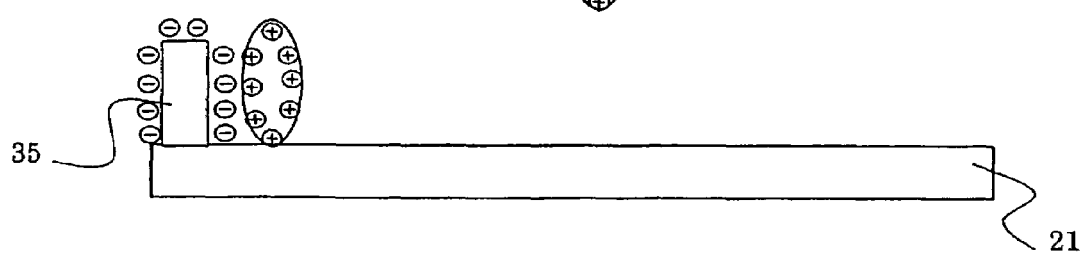

Thereafter, as shown in FIG. 6B, a dendrimer 10 having charge in the outermost shell opposite in polarity to the surface charge of the wall structure 35 is placed on the substrate 21. For example, a solution of this dendrimer 10 is applied to the substrate 21 on which the wall structure 35 is formed. A dipping or ink-jet method is preferably employed to apply the solution.

Figure 6C:
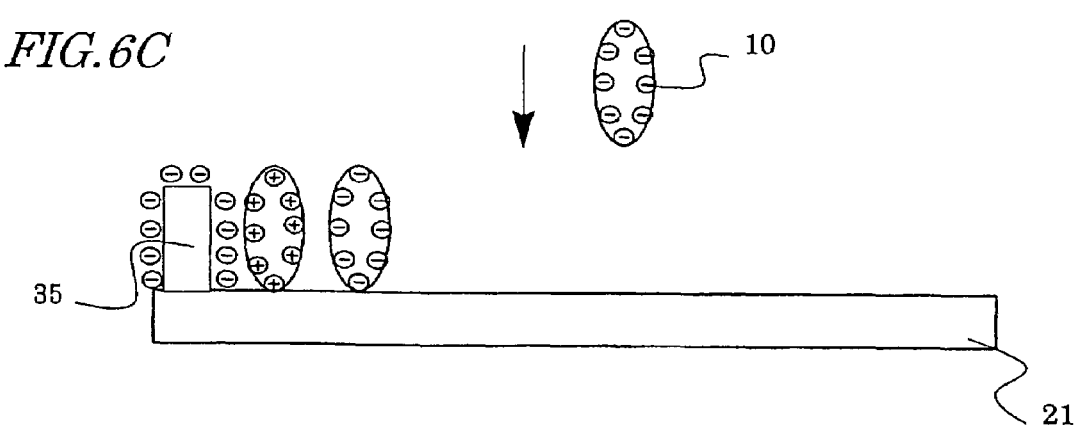
Figure 6D:
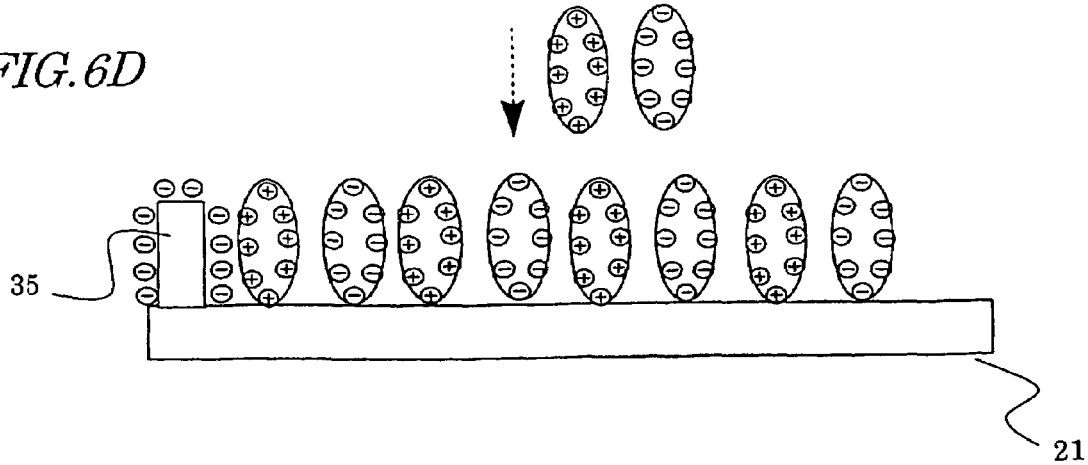

The dendrimer 10 is placed roughly in parallel with the charged side face of the wall structure 35, that is, roughly normal to the surface of the substrate 21 due to electrostatic interaction. Subsequently, a solution of a dendrimer 10 having charge opposite in polarity to the dendrimer 10 previously applied is applied. The presently-applied dendrimer forms a self-organized structure due to electrostatic interaction with the previously-applied dendrimer. By repeating this operation alternately as shown in FIGS. 6C and 6D, a hyperbranched polymer layer arranged by electrostatic interaction can be formed. The two types of dendrimers may be provided at one time by applying a mixture of dendrimers having charge of the opposite polarities.

By aligning the dendrimers roughly in parallel with the side face of the wall structure 35 using electrostatic interaction and forming self-organized structures of dendrimers as described above, it is possible to form a light emitting layer having a degree of alignment (0.95 or more) higher than the conventional light emitting layer formed using liquid crystallinity, and thus the emission polarization ratio can be improved.

It is also possible to form a hyperbranched polymer layer having a high degree of alignment using hydrogen bonding in a manner similar to that described above. A hydrogen-bonding atomic group is introduced to impart the hydrogen-bonding property to the side face of the wall structure 35. A combination of a carboxyl group and an amino group may be used as the hydrogen-bonding atomic groups. Specifically, the substrate 21 having the wall structure 35 thereon is dipped into a solution of a dendrimer having a carboxyl group in the outermost shell and a solution of a dendrimer having an amino group in the outermost shell alternately, to form the hyperbranched polymer layer uniaxially aligned with a high degree of alignment by hydrogen bonding. Alternatively, a mixture of a pair of dendrimers having hydrogen-bonding atomic groups may be applied.

Hereinafter, a further concrete embodiment of the present invention will be described.

In this embodiment, a light emitting layer having a high degree of alignment is formed using fluorene type dendrimers having negative charge in the outermost shell (Compound 3) and fluorene type dendrimers having positive charge in the outermost shell (Compound 4) by electrostatic interaction.

Figure 7A:
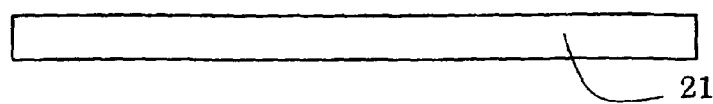
FIGS. 7A to 7E are diagrammatic views demonstrating a method for fabricating an organic EL light emitting device of an embodiment of the present invention.

First, as shown in FIG. 7A, a substrate (glass substrate, for example) 21 is prepared.

Figure 7B:
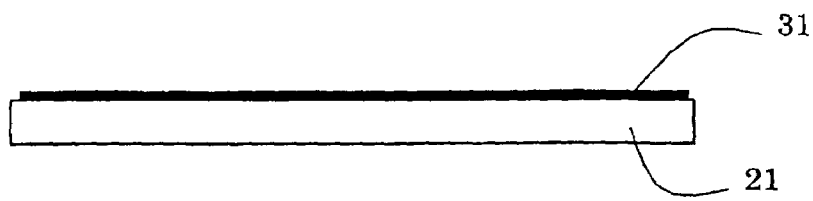

As shown in FIG. 7B, an electrode 31 is formed on a surface of the substrate 21. The electrode (positive electrode, for example) 31 is formed of ITO, for example. To impart the reflecting property, the electrode 31 may be formed of a metal material such as Al, or a reflection layer may be formed under the electrode 31, as required.

Figure 7C:
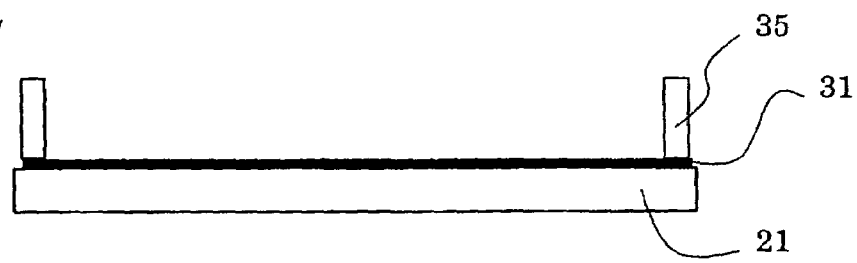

As shown in FIG. 7C, wall structures 35 are formed on the surface of the substrate 21 on which the electrode 31 is formed. The wall structures 35 may be formed on the electrode 31, or formed on openings of the electrode 31 if the electrode 31 is patterned (corresponding to pixels, for example). The wall structures 35 are formed by the method described above with reference to FIG. 6A.

In this embodiment, the wall structures 35 having negative charge on the surface are formed by applying an acrylic resin with an anionic surfactant introduced therein to the ITO substrate by spin coating and then patterning the acrylic resin film using a resist.

Figure 7D:
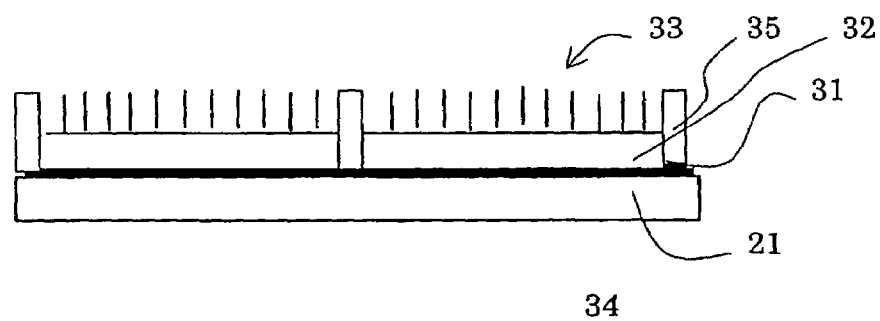

Thereafter, as shown in FIG. 7D, a hole transport layer 32 is formed. For example, the hole transport layer 32 is formed by applying a polyethylene-dioxy thiophene (PEDOT)/polystyrene sulfonate (PSS) solution to the resultant substrate by an ink-jet method and then performing sintering.

Thereafter, the resultant substrate is dipped into a solution of the fluorene type dendrimers having positive charge in the outermost shell (Compound 4), and then dipped into a solution of the fluorene type dendrimers having negative charge in the outermost shell (Compound 3). By repeating this operation, a dendrimer light emitting layer 33 is formed in which the dendrimers are aligned to stand roughly normal to the surface of the electrode 31. Excessive dendrimers of one polarity should preferably be removed before the substrate is dipped into the dendrimer solution of the opposite polarity by immersing the substrate into a solvent (water in this example). Such excessive dendrimers can be more reliably removed as the immersion time is longer. In this example, the substrate is immersed in water for about five minutes to remove excessive dendrimers, and then dipped into the dendrimer solution having the opposite charge. The step of removing excessive dendrimers should also preferably be performed when dendrimers hydrogen-bonding to each other are used.

The resultant dendrimer light emitting layer 33 includes dendrimers uniaxially aligned with a high degree of alignment by the electrostatic interactions between the wall structures 35 and the dendrimers and between the dendrimers. This dendrimer layer provides an emission polarization ratio of 99:1 or more as evaluated using the fluorescence intensity at 450 nm. The degree of alignment of the dendrimer light emitting layer 33 is 0.97 or more. Note that the dendrimer light emitting layer 33 also functions as the electron transport layer.

Figure 7E:
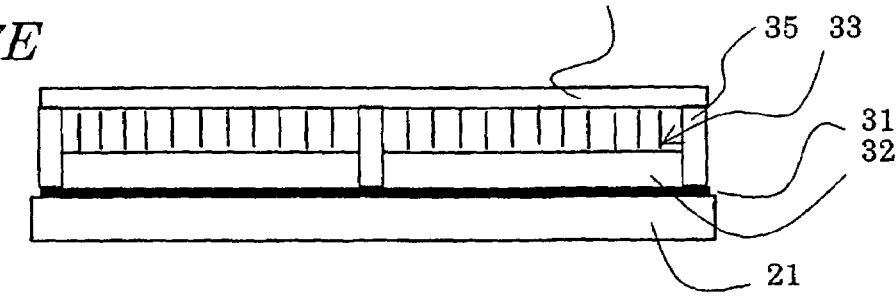

As shown in FIG. 7E, an electrode 34 is formed on the dendrimer light emitting layer 33. The electrode (negative electrode, for example) 34 is formed by evaporation of a Li—Al film, for example. Thereafter, the resultant substrate is subjected to sealing for protection of the organic EL light emitting layer (including 32 and 35) and other processing, to complete the organic EL light emitting device. The resultant organic EL light emitting device maintains the emission polarization ratio described above, and the degree of alignment of the dendrimer light emitting layer 33 is kept unchanged after the formation of the electrode 34.

The dendrimer light emitting layer 33 having a high degree of alignment can also be formed using the hydrogen-bonding fluorene type dendrimer compounds 5 and 6 in a manner similar to that described above.

For example, in the process step shown in FIG. 7C, an acrylic resin with polyacrylic acid introduced therein is applied to the substrate 21 by spin coating and then patterned using a resist, to form the wall structures 35 having carboxylic acid on the surface.

As described above with reference to FIG. 7D, the hole transport layer 32 is formed using PEDOT/PSS, and then the resultant substrate is dipped into a solution of fluorene type dendrimers having an amino group in the outermost shell and then dipped into a solution of fluorene type dendrimers having a carboxylic acid in the outermost shell. By repeating this operation, the dendrimer light emitting layer 33 is formed in which the dendrimers are axially aligned with a high degree of alignment by hydrogen bonding.

The dendrimer light emitting layer 33 formed in the above manner also provides an emission polarization ratio of 99:1 or more, and has a degree of alignment of 0.97 or more. The degree of alignment does not decrease after the formation of the Li—Al electrode 34 on the dendrimer light emitting layer 33.

For comparison, formation of an organic EL light emitting layer using conventional materials will be described.

A poly-p-phenylele vinylene film as the hole transport layer is formed on the surface of the substrate on which the ITO electrode is formed. The poly-p-phenylele vinylene film is rubbed, and then a light emitting layer is formed on this film using polyoctylfluorene.

The emission polarization ratio of the thus-obtained light emitting layer is about 92:8 as evaluated using the fluorescence intensity at 450 nm. The degree of alignment of the light emitting layer is about 0.78.

As is found from the above results, an organic EL light emitting layer uniaxially aligned with a high degree of alignment is obtained by using the strong non-covalent bonding interaction of the hyperbranched macromolecules.

The materials used for the electrodes of the organic EL light emitting device of the present invention are not limited to those described above. As the positive electrode material, a transparent conductive material such as ZnO and $SnO_2$ may be used. As the negative electrode material, an alloy material such as a Mg—Ag alloy and a Mg—In alloy may be suitably used. These metal materials have a work function allowing high-efficiency emission. These electrodes can be formed by sputtering, vacuum evaporation or the like.

Figure 8A:
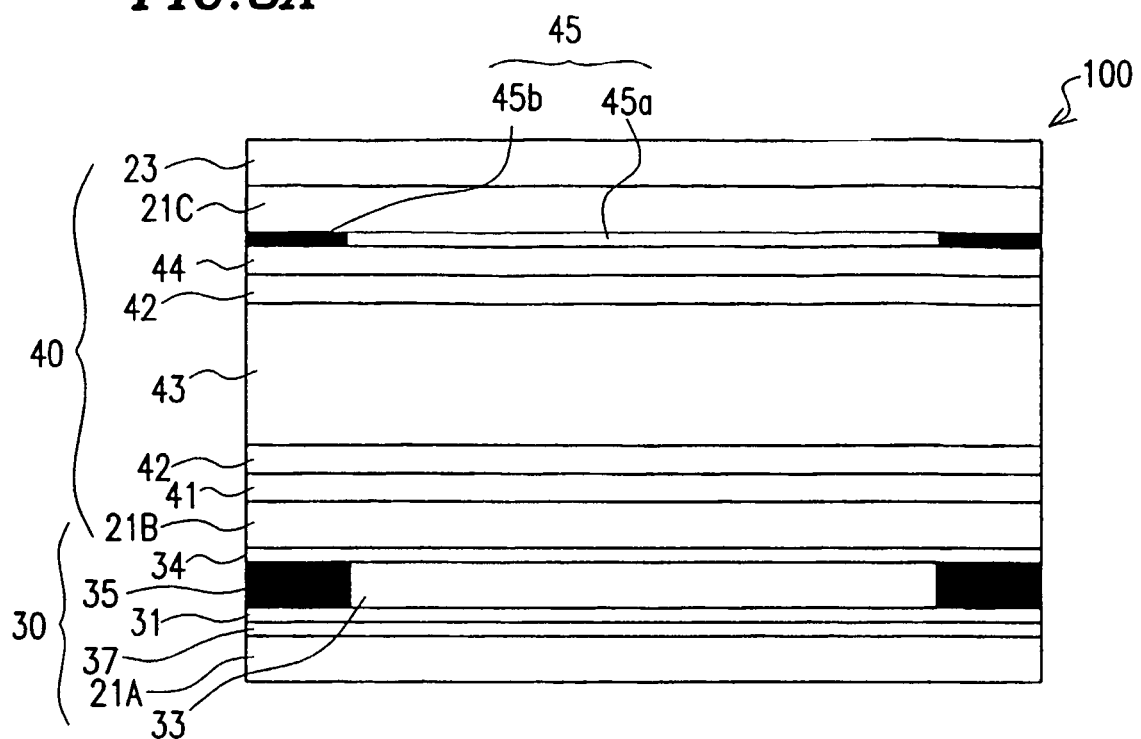
FIG. 8A is a diagrammatic cross-sectional view of a liquid crystal display of an embodiment of the present invention.
Figure 8B:
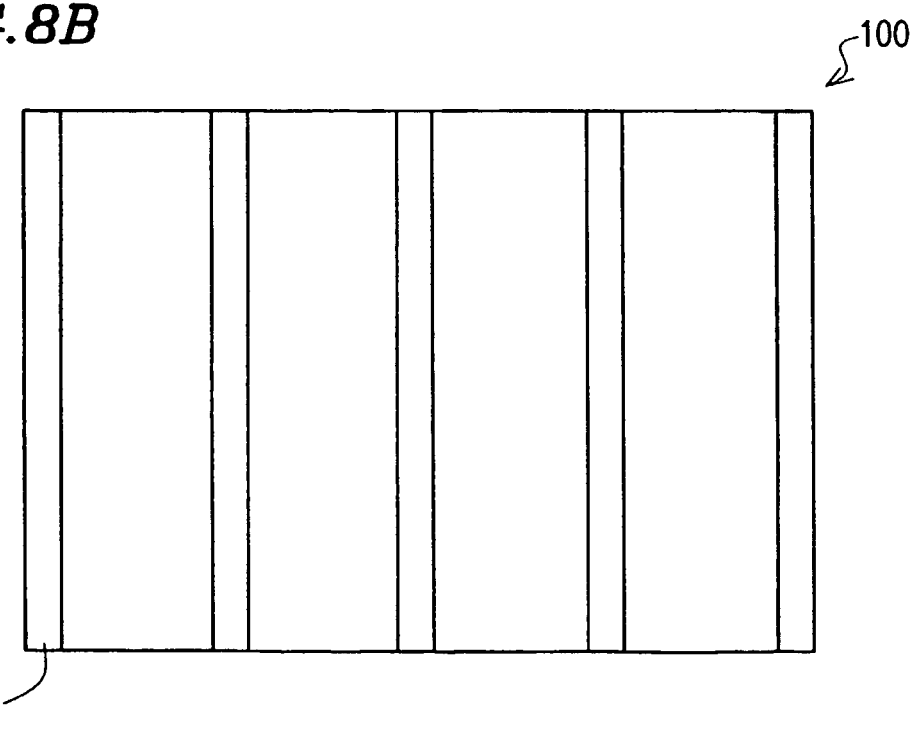
FIG. 8B is a plan view showing placement of wall structures of an organic EL light emitting device included in the liquid crystal display.

Next, referring to FIGS. 8A and 8B, a liquid crystal display 100 having the organic EL light emitting device described above will be described.

The liquid crystal display 100 includes the organic EL light emitting device 30 described above and a liquid crystal panel 40 integrally formed therewith. The organic EL light emitting device 30 functions as the backlight of the liquid crystal display 100. The organic EL light emitting device 30 and the liquid crystal panel 40 share a substrate 21B, and no polarizer is provided therebetween.

The organic EL light emitting device 30 includes a substrate 21A, a reflection layer 37, an electrode (positive electrode) 31, an organic EL light emitting layer 33, another electrode (negative electrode) 34 and the substrate 21B placed in this order. The organic EL light emitting layer 33 is in the uniaxially aligned state obtained by use of wall structures 35 as described above. The reflection layer 37 may be omitted.

The liquid crystal panel 40, which can be any of various types of known liquid crystal panels, includes the substrate 21B, pixel electrodes 41, one of paired alignment films 42, a liquid crystal layer 43, the other alignment film 42, a counter electrode 44, a color filter layer 45, a substrate 21C and a polarizer 23, for example, placed in this order. The liquid crystal layer 43 is a TN liquid crystal layer, for example. The polarization plate 23 has its transmission axis orthogonal to the polarization axis of linearly-polarized light emitted from the organic EL light emitting device 30. The liquid crystal panel performs display in the normally white mode. Interconnections and switch elements (TFTs, for example) for applying voltages to the pixel electrodes 41 and the counter electrode 44 are placed as required. The color filter layer 45 includes color filter portions 45b corresponding to R, G and B colors and a black matrix 45a for shading inter-pixel spaces.

The wall structures 35 for control of the alignment of the organic EL light emitting layer 33 are preferably placed to correspond to the black matrix 45a. In other words, the organic EL light emitting layer 33 is placed to correspond to the pixels (openings) so that light from the organic EL light emitting layer 33 is not blocked by the black matrix 45b. In this way, the light use efficiency can be enhanced. For example, as shown in FIG. 8B, the wall structures 35 are formed in a striped shape along the arrangement of the pixels to correspond to inter-pixel spaces. The wall structures 35 are not necessarily formed to correspond to the respective pixels as shown in FIG. 8A, but a plurality of pixels may exist between the adjacent wall structures 35. If the wall structures 35 are formed of a transparent resin, loss of light will be advantageously small even if a displacement occurs during the alignment between the organic EL light emitting device 30 and the liquid crystal panel 40.

As described above, by using the organic EL light emitting device of the present invention as the backlight of a liquid crystal display, one polarizer can be omitted. In addition, since the emission polarization ratio of light emitted from the organic EL light emitting device is 50:1 or more, a contrast ratio (100:1, for example) higher than that conventionally obtained is attained.

The organic EL light emitting device of the present invention can be used, not only as the backlight of a liquid crystal display, but also as a laser and an actuator.

According to the present invention, an organic EL light emitting device having a higher emission polarization ratio than that conventionally obtained is provided. By using the organic EL light emitting device as the back-light of a liquid crystal display, one polarizer can be omitted and the contrast ratio of the liquid crystal display can be improved.

The invention claimed is:

1. An organic EL light emitting device comprising an organic EL light emitting layer and an electrode for applying a voltage to the organic EL light emitting layer, wherein the organic EL light emitting layer includes a hyperbranched polymer layer having hyperbranched macromolecules uniaxially aligned with a degree of alignment of 0.95 or more and emits polarized light.

2. The organic EL light emitting device of claim 1, wherein the hyperbranched polymer layer includes self-organized disc-shaped hyperbranched macromolecules.

3. The organic EL light emitting device of claim 1, wherein the hyperbranched polymer layer includes self-organized rod-shaped hyperbranched macromolecules.

4. The organic EL light emitting device of claim 1, wherein the hyperbranched macromolecules include dendrimers.

5. The organic EL light emitting device of claim 1, wherein the hyperbranched macromolecules are self-organized by electrostatic interaction.

6. The organic EL light emitting device of claim 1, wherein the hyperbranched macromolecules are self-organized by hydrogen bonding.

7. The organic EL light emitting device of claim 1, wherein the hyperbranched polymer layer includes a first hyperbranched polymer layer functioning as an electron transport layer or a hole transport layer and a second hyperbranched polymer layer functioning as at least a light emitting layer.

8. An organic EL light emitting device comprising:
an organic EL light emitting layer and an electrode for applying a voltage to the organic EL light emitting layer; and
a wall structure having a side face roughly perpendicular to a surface of the hyperbranched polymer layer, wherein the hyperbranched macromolecules are aligned roughly in parallel with the side face by interaction with the wall structure; wherein
the organic EL light emitting layer includes a hyperbranched polymer layer having hyperbranched macromolecules uniaxially aligned with a degree of alignment of 0.95 or more and emits polarized light.

9. The organic EL light emitting device of claim 8, wherein the side face of the wall structure is charged, and the hyperbranched macromolecules electrostatically interact with the side face.

10. The organic EL light emitting device of claim 8, wherein the side face of the wall structure has a hydrogen-bonding property, and the hyperbranched macromolecules hydrogen-bond with the side face.

11. A liquid crystal display comprising the organic EL light emitting device of claim 1 and a liquid crystal panel receiving polarized light emitted from the organic EL light emitting device and controlling the transmittance of the polarized light.

12. A liquid crystal display comprising:
an organic EL light emitting device comprising an organic EL light emitting layer and an electrode for applying a voltage to the organic EL light emitting layer; and
a liquid crystal panel receiving polarized light emitted from the organic EL light emitting device and controlling the transmittance of the polarized light; wherein
the organic EL light emitting layer includes a hyperbranched polymer layer having hyperbranched macromolecules uniaxially aligned with a degree of alignment of 0.95 or more and emits polarized light;

the organic EL light emitting device includes a wall structure having a side face roughly perpendicular to a surface of the hyperbranched polymer layer, the hyperbranched macromolecules being aligned roughly in parallel with the side face by interaction with the wall structure;

the liquid crystal panel has a plurality of pixels and a black matrix shading spaces between the plurality of pixels; and the wall structure of the organic EL light emitting device is formed to correspond to the black matrix of the liquid crystal panel.

13. A method for fabricating an organic EL light emitting device having an organic EL light emitting layer and an electrode for applying a voltage to the organic EL light emitting layer, the organic EL light emitting device emitting polarized light, the method comprising the steps of:

(a) preparing a substrate having an electrode formed on its principal plane;

(b) forming a wall structure on the principal plane, the wall structure having a side face roughly perpendicular to the principal plane; and (c) providing a material including hyperbranched macromolecules on the principal plane to form the organic EL light emitting layer including a hyperbranched polymer layer having the hyperbranched macromolecules aligned roughly in parallel with the side face.

14. The method of claim 13, wherein the step (b) comprises the step of charging the side face, and the hyperbranched macromolecules are aligned roughly in parallel with the side face by electrostatic interaction with the side face.

15. The method of claim 14, further comprising the step of providing a material including other hyperbranched macromolecules electrostatically interacting with the previous hyperbranched macromolecules.

16. The method of claim 13, wherein the step (b) comprises the step of imparting a hydrogen-bonding property to the side wall, and the hyperbranched macromolecules are aligned roughly in parallel with the side wall by hydrogen bonding with the side face.

17. The method of claim 16, further comprising the step of providing a material including other hyperbranched macromolecules hydrogen-bonding with the previous hyperbranched macromolecules.

18. An organic EL light emitting device comprising an organic EL light emitting layer and an electrode for applying a voltage to the organic EL light emitting layer; wherein the organic EL light emitting layer includes a hyperbranched polymer layer having uniaxially aligned hyperbranched macromolecules and emits polarized light;

the organic EL light emitting device further includes a wall structure having a side face roughly perpendicular to a surface of the hyperbranched polymer layer; and the hyperbranched macromolecules are aligned roughly in parallel with the side face of the wall structure.

19. The organic EL light emitting device of claim 18, wherein the hyperbranched polymer layer includes self-organized disc-shaped hyperbranched macromolecules.

20. The organic EL light emitting device of claim 18, wherein the side face of the wall structure is charged; and the hyperbranched macromolecules electrostatically interact with the side face.

21. The organic EL light emitting device of claim 18, wherein the side face of the wall structure has a hydrogen-bonding property; and the hyperbranched macromolecules hydrogen-bond with the side face.

* * * * *